(12) United States Patent
Ota et al.

(10) Patent No.: US 11,863,158 B2
(45) Date of Patent: Jan. 2, 2024

(54) ACOUSTIC WAVE RESONATOR AND MULTIPLEXER

(71) Applicant: Murata Manufacturing Co., Ltd., Nagaokakyo (JP)

(72) Inventors: Noriyoshi Ota, Nagaokakyo (JP); Akira Michigami, Nagaokakyo (JP); Keiji Okada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 631 days.

(21) Appl. No.: 17/016,692

(22) Filed: Sep. 10, 2020

(65) Prior Publication Data

US 2020/0412327 A1    Dec. 31, 2020

Related U.S. Application Data

(63) Continuation of application No. PCT/JP2019/013736, filed on Mar. 28, 2019.

(30) Foreign Application Priority Data

Mar. 29, 2018 (JP) .................................. 2018-064992

(51) Int. Cl.
*H03H 9/145* (2006.01)
*H03H 9/25* (2006.01)
(Continued)

(52) U.S. Cl.
CPC ...... *H03H 9/14526* (2013.01); *H03H 9/0009* (2013.01); *H03H 9/02559* (2013.01);
(Continued)

(58) Field of Classification Search
CPC ........ H03H 9/14526; H03H 9/25; H03H 9/64; H03H 9/72
See application file for complete search history.

(56) References Cited

U.S. PATENT DOCUMENTS 4,146,808 A * 3/1979 Laker ................. H03H 9/14526
310/313 B
4,491,758 A * 1/1985 Hartmann .......... H03H 9/14526
310/313 C (Continued)

FOREIGN PATENT DOCUMENTS

JP       55-3281 A    1/1980
JP    02-122715 A    5/1990
(Continued)

OTHER PUBLICATIONS

Official Communication issued in International Patent Application No. PCT/JP2019/013736, dated Jun. 4, 2019.

*Primary Examiner* — Andrea Lindgren Baltzell
*Assistant Examiner* — Alan Wong
(74) *Attorney, Agent, or Firm* — Keating & Bennett, LLP

(57) ABSTRACT

An acoustic wave resonator includes an IDT electrode that is on or above a piezoelectric plate and includes a periodic withdrawal weighted portion in each of a plurality of regions for at least two or more periods in an acoustic wave propagation direction. A periodic withdrawal weighted portion in at least one of the regions is different from a periodic withdrawal weighted portion in at least one of the other regions.

19 Claims, 12 Drawing Sheets

(51) Int. Cl.
*H03H 9/64* (2006.01)
*H03H 9/72* (2006.01)
*H03H 9/00* (2006.01)
*H03H 9/02* (2006.01)

(52) U.S. Cl.
CPC .......... *H03H 9/02637* (2013.01); *H03H 9/25* (2013.01); *H03H 9/6483* (2013.01); *H03H 9/72* (2013.01)

(56) References Cited

U.S. PATENT DOCUMENTS

| | | | |
|---|---|---|---|
| 5,952,765 A * | 9/1999 | Garber | H03H 9/6433 333/195 |
| 6,462,632 B1 | 10/2002 | Fujii et al. | |
| 6,552,632 B2 * | 4/2003 | Inoue | H03H 9/25 310/313 C |
| 6,570,471 B2 * | 5/2003 | Inoue | H03H 9/6423 333/195 |
| 7,075,390 B1 * | 7/2006 | Bungo | H03H 9/14505 310/313 A |
| 7,518,471 B2 * | 4/2009 | Takahashi | H03H 9/02724 310/313 C |
| 9,083,305 B2 * | 7/2015 | Tsuda | H03H 9/14535 |
| 10,530,336 B2 * | 1/2020 | Takamine | H03H 9/02574 |
| 2002/0153969 A1 | 10/2002 | Inoue et al. | |
| 2006/0226933 A1 | 10/2006 | Takahashi | |
| 2018/0123565 A1 | 5/2018 | Takamine | |

FOREIGN PATENT DOCUMENTS

| | | | | |
|---|---|---|---|---|
| JP | 02122715 A | * | 5/1990 | |
| JP | 11-163664 A | | 6/1999 | |
| JP | 2000-315931 A | | 11/2000 | |
| JP | 2002-319842 A | | 10/2002 | |
| JP | 2002-353769 A | | 12/2002 | |
| JP | 2004-363641 A | | 12/2004 | |
| JP | 2006-295434 A | | 10/2006 | |
| JP | 2012-147175 A | | 8/2012 | |
| JP | 2013-070272 A | | 4/2013 | |
| JP | 2013-247569 A | | 12/2013 | |
| JP | 2016-192696 A | | 11/2016 | |
| WO | 2016/208677 A1 | | 12/2016 | |
| WO | WO-2016208677 A1 | * | 12/2016 | .......... H03H 9/02574 |

* cited by examiner

ACOUSTIC WAVE RESONATOR AND MULTIPLEXER

CROSS REFERENCE TO RELATED APPLICATIONS

This application claims the benefit of priority to Japanese Patent Application No. 2018-064992 filed on Mar. 29, 2018 and is a Continuation Application of PCT Application No. PCT/JP2019/013736 filed on Mar. 28, 2019. The entire contents of each application are hereby incorporated herein by reference.

BACKGROUND OF THE INVENTION

1. Field of the Invention

The present invention relates to an acoustic wave resonator and a multiplexer including acoustic wave resonators.

2. Description of the Related Art

In the related art, ladder acoustic wave filters are widely used as bandpass filters in mobile communication devices. A ladder acoustic wave filter includes series-arm resonators and parallel-arm resonators. Series-arm resonators and parallel-arm resonators are defined by acoustic wave resonators. The steepness in the filter characteristics of a ladder acoustic wave filter is primarily determined by a frequency difference Δf between a resonant frequency fr and an anti-resonant frequency fa of a resonator.

Withdrawal weighting is performed on an interdigital transducer (IDT) electrode in acoustic wave resonators described in Japanese Unexamined Patent Application Publication No. 11-163664 and Japanese Unexamined Patent Application Publication No. 2002-319842 below. In Japanese Unexamined Patent Application Publication No. 11-163664, electrode fingers of the IDT electrode are withdrawn periodically. In addition, in Japanese Unexamined Patent Application Publication No. 2002-319842, electrode fingers of the IDT electrode are withdrawn non-periodically. Such configurations can make the frequency difference Δf between the resonant frequency and the anti-resonant frequency of a surface acoustic wave resonator small.

However, when acoustic wave resonators according to Japanese Unexamined Patent Application Publication No. 11-163664 in which electrode fingers are withdrawn periodically are used in a ladder filter, a spurious response is caused outside the pass band of the ladder filter. Therefore, in a multiplexer in which a plurality of bandpass filters are connected in common at one end, the bandpass characteristics of the other common-connected bandpass filters deteriorate in some cases.

On the other hand, when acoustic wave resonators according to Japanese Unexamined Patent Application Publication No. 2002-319842 in which electrode fingers are withdrawn non-periodically are used, a spurious response can be suppressed outside the pass band of a ladder filter including the acoustic wave resonators but the bandpass characteristics in the pass band may deteriorate.

Therefore, it is difficult to achieve both an improvement of the characteristics in the pass band and an improvement of the characteristics outside the pass band of a ladder filter including acoustic wave resonators in a multiplexer created using the acoustic wave resonators.

SUMMARY OF THE INVENTION

Preferred embodiments of the present invention provide acoustic wave resonators that are each able to improve both characteristics in a pass band and characteristics outside the pass band when the acoustic wave resonator is used in a bandpass filter. In addition, preferred embodiments of the present invention provide multiplexers each including an acoustic wave resonator according to a preferred embodiment of the present invention.

An acoustic wave resonator according to a preferred embodiment of the present invention includes a piezoelectric body, and an IDT electrode that is on or above the piezoelectric body and that has a withdrawal weighted portion, in which the IDT electrode includes a plurality of regions in an acoustic wave propagation direction, and includes a periodic withdrawal weighted portion in each of the plurality of regions for at least two or more periods, and a periodicity of the periodic withdrawal weighted portion in at least one of the regions is different from a periodicity of the periodic withdrawal weighted portion in at least another one of the regions.

A multiplexer according to a preferred embodiment of the present invention includes a common terminal, and a plurality of bandpass filters each including one end connected in common to the common terminal, in which at least one of the bandpass filters has a pass band that is different from pass bands of the other bandpass filters, the at least one of the bandpass filters is an acoustic wave filter including a plurality of acoustic wave resonators, and at least one of the plurality of acoustic wave resonators is an acoustic wave resonator according to a preferred embodiment of the present invention.

Acoustic wave resonators according to preferred embodiments of the present invention are each able to improve both characteristics in a pass band and characteristics outside the pass band of a bandpass filter including the acoustic wave resonator. In multiplexers according to preferred embodiments of the present invention, both an improvement of characteristics in a pass band and an improvement of characteristics outside the pass band of a bandpass filter including an acoustic wave resonator according to a preferred embodiment of the present invention are able to be achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings to clarify the present invention.

Note that each preferred embodiment described herein is merely illustrative and the configurations can be partly replaced or combined with each other in different preferred embodiments.

Figure 1:
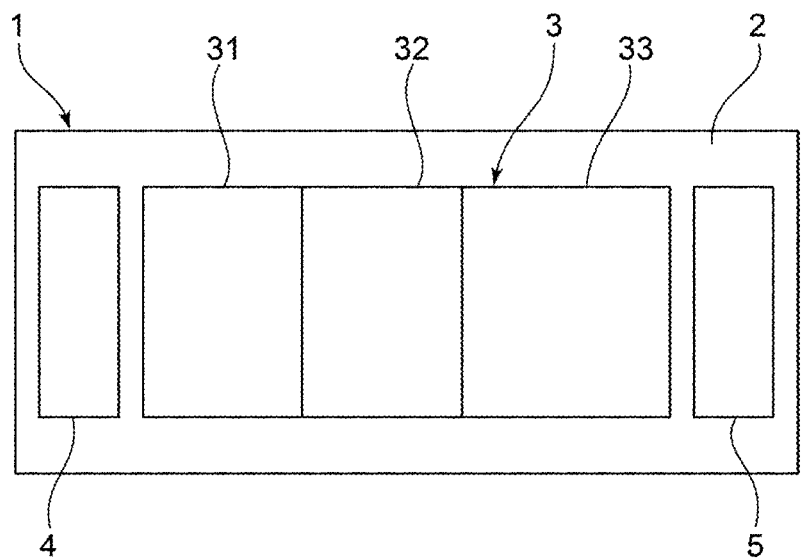
FIG. 1 is a plan view of an acoustic wave resonator according to a first preferred embodiment of the present invention.
Figure 6:
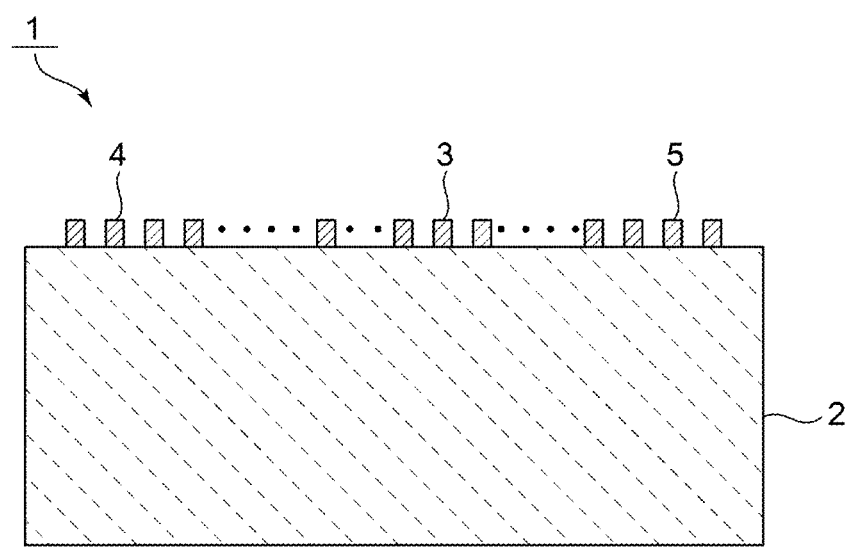
FIG. 6 is a front sectional view of the acoustic wave resonator according to the first preferred embodiment of the present invention.

FIG. 1 is a plan view of an acoustic wave resonator according to a first preferred embodiment of the present invention. An acoustic wave resonator 1 includes a piezoelectric plate 2 which defines and functions as a piezoelectric body. An IDT electrode 3 is disposed on the piezoelectric plate 2. A reflector 4 and a reflector 5 are disposed on respective sides of the IDT electrode 3 in an acoustic wave propagation direction. The acoustic wave resonator 1 is a single-port acoustic wave resonator. FIG. 6 is a front sectional view of the acoustic wave resonator. The IDT electrode 3 and the reflectors 4 and 5 are disposed on the piezoelectric plate 2, but may be disposed above the piezoelectric plate 2 with a layer, such as an insulating layer, for example, interposed between the piezoelectric plate 2 and the IDT electrode 3 and between the piezoelectric plate 2 and the reflectors 4 and 5. The piezoelectric plate 2 is made of an appropriate piezoelectric material such as a piezoelectric single crystal, which may preferably be $LiNbO_3$, $LiTaO_3$, or the like, or piezoelectric ceramics, for example.

In place of the piezoelectric plate 2, for example, a piezoelectric substrate in which a piezoelectric film is stacked on or above a semiconductor layer or an insulating layer may be used. In the case of the piezoelectric substrate, the piezoelectric film corresponds to the piezoelectric body.

Withdrawal weighting is performed on the IDT electrode 3. The IDT electrode 3 includes a first region 31 to a third region 33, as a plurality of regions arranged in the acoustic wave propagation direction. In the first region 31 to the third region 33 of the IDT electrode 3, periodicities of withdrawal weighting are different from one another. When a portion in which, for example, one electrode finger is withdrawn per nine electrode fingers is used as an example, being periodic means that this portion is repeated two or more times, that is, for two or more periods. Having different periodicities means that this periodic withdrawal is different. For example, weighting in which one of nine electrode fingers is withdrawn and weighting in which one of six electrode fingers is withdrawn have different periodicities.

Figure 2:
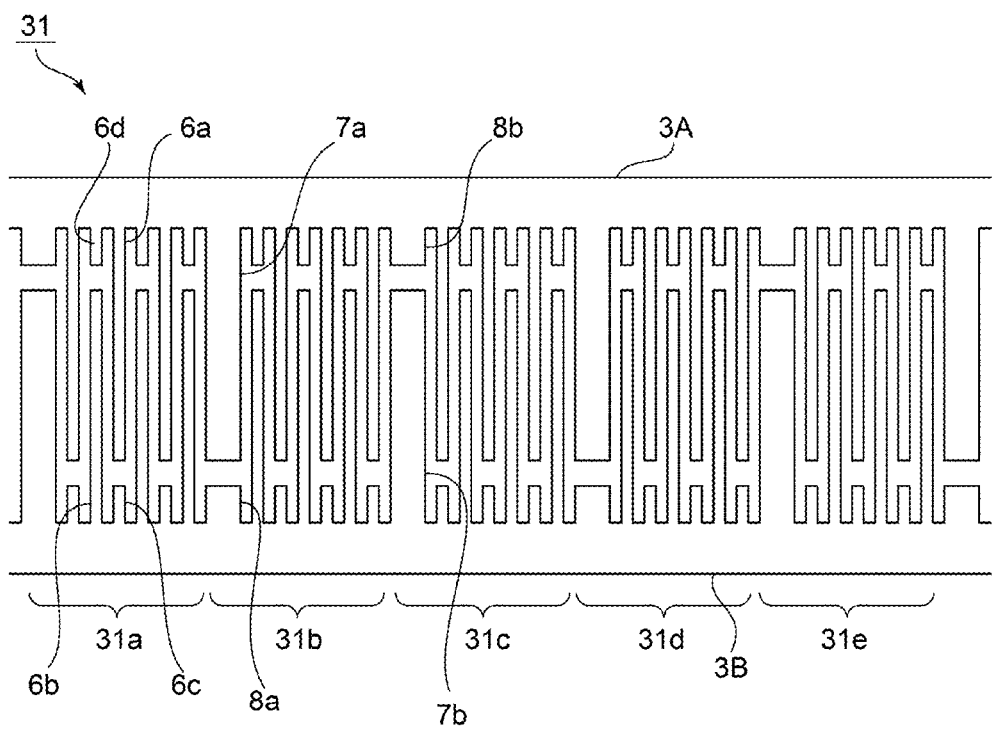
FIG. 2 is an enlarged partial cutout plan view for describing withdrawal weighting in a first region of an IDT electrode of the acoustic wave resonator according to the first preferred embodiment of the present invention.

FIG. 2 is an enlarged partial cutout plan view for describing withdrawal weighting in the first region 31.

A first busbar 3A and a second busbar 3B of the IDT electrode 3 extend in the acoustic wave propagation direction. One end of each of a plurality of first electrode fingers 6a is linked to the first busbar 3A. One end of each of a plurality of second electrode fingers 6b is linked to the second busbar 3B. The plurality of first electrode fingers 6a and the plurality of second electrode fingers 6b interdigitate with each other.

Dummy electrode fingers 6c are separate from tips of the respective first electrode fingers 6a with respective gaps therebetween. The dummy electrode fingers 6c are linked to the second busbar 3B. Dummy electrode fingers 6d are separate from tips of the respective second electrode fingers 6b with respective gaps therebetween. The dummy electrode fingers 6d are linked to the first busbar 3A. Note that the dummy electrode fingers 6c and 6d may be omitted.

In the first region 31, the electrode fingers are withdrawn at a rate of one of nine in the acoustic wave propagation direction. Wide electrode fingers 7a and 7b are disposed in the respective portions in which the electrode fingers have been withdrawn. The term "width-direction dimension" of an electrode finger refers to a dimension in the acoustic wave propagation direction. As described above, the first electrode fingers 6a or the second electrode fingers 6b are withdrawn at the rate of one of nine. A plurality of portions 31a to 31e in which the electrode fingers are withdrawn at the rate of one of nine are arranged periodically in the acoustic wave propagation direction. Thus, withdrawal weighting is performed periodically in the first region 31.

The wide electrode fingers 7a linked to the first busbar 3A each have a shape in which a region between the first electrode finger 6a and the first electrode finger 6a that are closest to each other in the acoustic wave propagation direction is metallized. The wide electrode fingers 7b linked to the second busbar 3B each have a shape in which a region between the second electrode finger 6b and the second electrode finger 6b that are closest to each other in the acoustic wave propagation direction is metallized. Six first and second electrode fingers 6a and 6b in total are disposed between each of the wide electrode fingers 7a and the closest wide electrode finger 7b. Note that wide dummy electrode fingers 8a linked to the second busbar 3B and wide dummy electrode fingers 8b linked to the first busbar 3A respectively oppose the wide electrode fingers 7a and the wide electrode fingers 7b with respective gaps therebetween.

Figure 3:
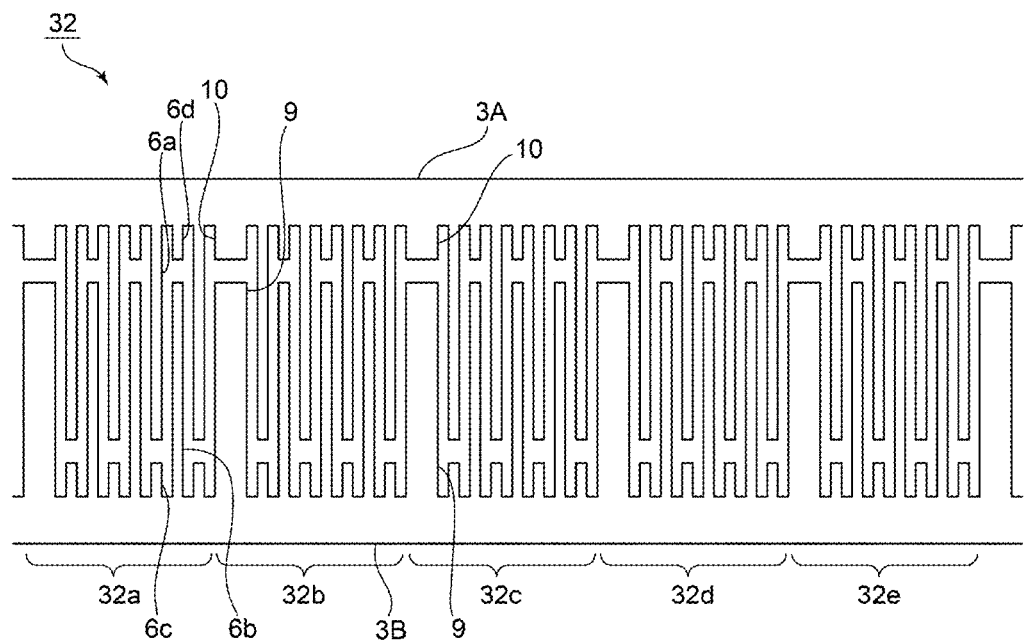
FIG. 3 is an enlarged partial cutout plan view for describing withdrawal weighting in a second region of the IDT electrode of the acoustic wave resonator according to the first preferred embodiment of the present invention.

FIG. 3 is an enlarged partial cutout plan view for describing withdrawal weighting in the second region 32. In the second region 32, the electrode fingers are withdrawn at a rate of one of ten in the acoustic wave propagation direction. In this manner, withdrawal weighting is performed. The second region 32 is configured in the same or substantially the same manner as the first region 31 except for the periodicity of this withdrawal weighting. Each region between the second electrode fingers 6b that are closest to each other in the acoustic wave propagation direction is metallized. Thus, wide electrode fingers 9 are disposed. Seven first and second electrode fingers 6a and 6b in total are disposed between the wide electrode fingers 9 that are adjacent to each other. The wide electrode fingers 9 are linked to the second busbar 3B. Wide dummy electrode fingers 10 are disposed to oppose the respective wide electrode fingers 9 with respective gaps therebetween.

The second region 32 includes a plurality of portions 32a to 32e arranged in the acoustic wave propagation direction. Each of the portions 32a, 32b, 32c, 32d, and 32e is a portion in which the electrode fingers are withdrawn at the rate of one of ten. Thus, withdrawal weighting is also performed periodically in the second region 32.

Figure 4:
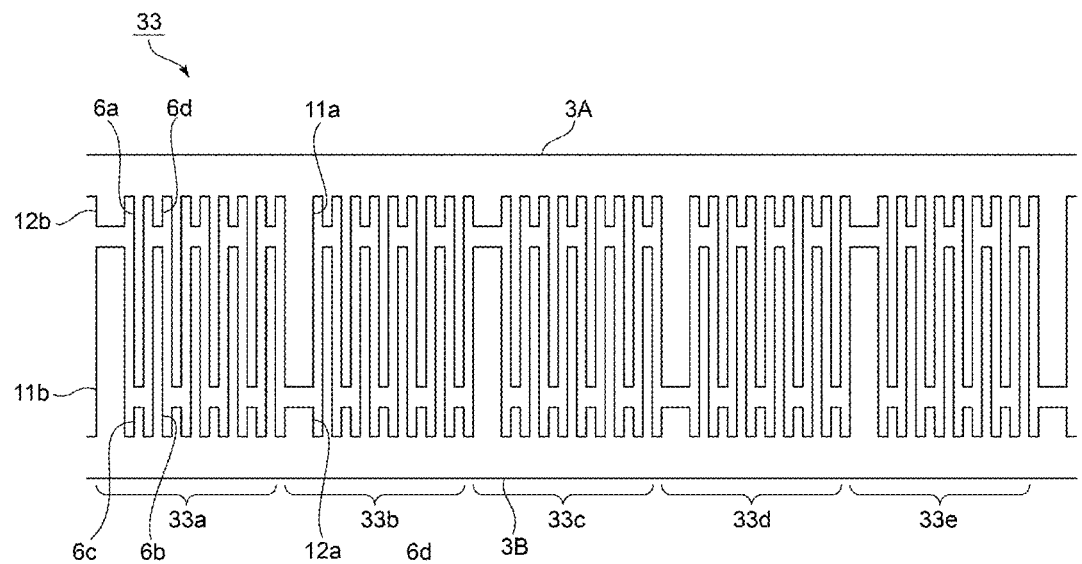
FIG. 4 is an enlarged partial cutout plan view for describing withdrawal weighting in a third region of the IDT electrode of the acoustic wave resonator according to the first preferred embodiment of the present invention.

FIG. 4 is a partial cutout plan view for describing withdrawal weighting in the third region 33. In the third region 33, weighting is performed in each of portions 33a to 33e such that the electrode fingers are withdrawn at a rate of one of eleven. The remaining configuration is the same or substantially the same as those of the first region 31 and the second region 32. As described above, the electrode fingers are withdrawn at the rate of one of eleven. Thus, wide electrode fingers 11a linked to the first busbar 3A and wide electrode fingers 11b linked to the second busbar 3B are disposed. Eight first and second electrode fingers 6a and 6b in total are disposed between each of the wide electrode fingers 11a and the closest wide electrode finger 11b. Wide dummy electrode fingers 12a are linked to the second busbar 3B. Wide dummy electrode fingers 12b are linked to the first busbar 3A. The wide dummy electrode fingers 12a and 12b respectively oppose the wide electrode fingers 11a and 11b with respective gaps therebetween.

As illustrated in FIGS. 2 to 4, the electrode fingers are withdrawn at an equal or substantially equal interval in the acoustic wave propagation direction in each of the first region 31 to the third region 33. That is, periodic withdrawal weighting is performed. When a portion in which, for example, one electrode finger is withdrawn per nine electrode fingers is used as an example, being periodic means that this portion is repeated two or more times, that is, for two or more periods.

On the other hand, as described above, the periodic withdrawal weighting in the first region 31, the periodic withdrawal weighting in the second region 32, and the periodic withdrawal weighting in the third region 33 are different from one another. That is, the periodicity of the periodic withdrawal weighting in the first region 31, the periodicity of the periodic withdrawal weighting in the second region 32, and the periodicity of the periodic withdrawal weighting in the third region 33 are different from one another.

Figure 5:
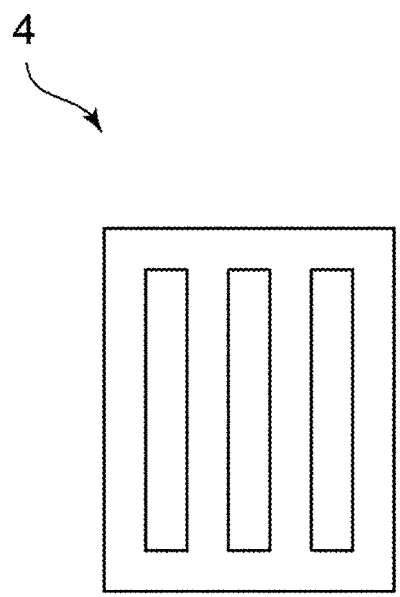
FIG. 5 is a plan view of a reflector of the acoustic wave resonator according to the first preferred embodiment of the present invention.

Referring back to FIG. 1, the reflectors 4 and 5 are ordinary grating reflectors. As illustrated in FIG. 5, both ends of a plurality of electrode fingers are short-circuited in the reflector 4.

The IDT electrode 3 and the reflectors 4 and 5 are made of an appropriate metal or alloy such as AlCu alloy, for example. In addition, a multilayer metal film in which a plurality of metal films are stacked may be used.

In the acoustic wave resonator 1, the IDT electrode 3 includes the first region 31 to the third region 33 in the acoustic wave propagation direction, periodic withdrawal weighting is performed in each of the first region 31 to the third region 33, and periodicities of the withdrawal weighting in the first region 31 to the third region 33 are different from one another. However, the present invention is not limited to the configuration in which the periodicities of withdrawal weighting in a plurality of regions are different from one another, and it is sufficient that periodic withdrawal weighting in at least one of the regions is different from periodic withdrawal weighting in at least another one of the regions. In addition, the number of regions is not limited to three, and it is sufficient that there are a plurality of regions.

The IDT electrode 3 preferably has asymmetrical withdrawal weighting on respective sides of the center of the IDT electrode 3 in the acoustic wave propagation direction. In such a case, both the characteristics in the pass band and the characteristics outside the pass band can be improved more effectively.

Figure 7:
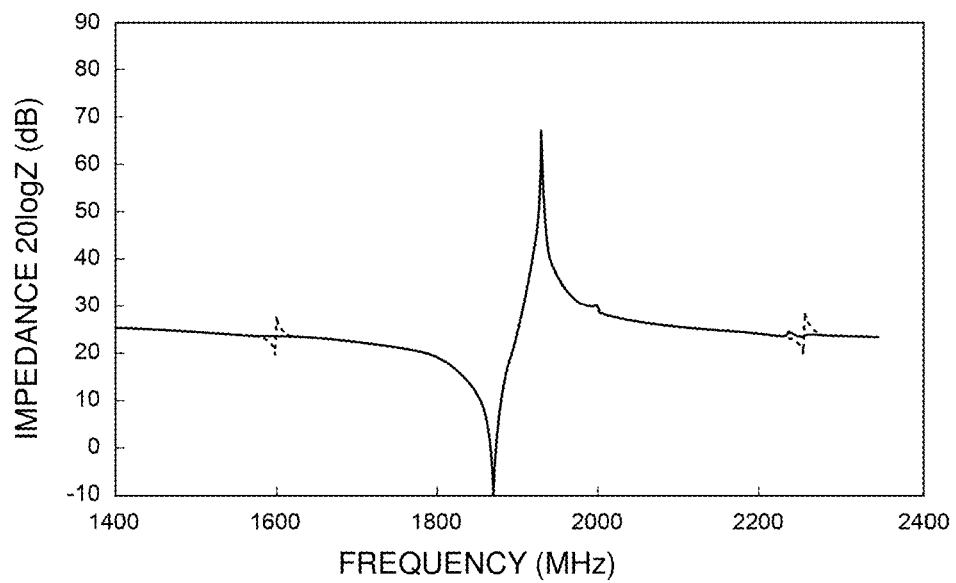
FIG. 7 is a graph illustrating impedance characteristics of acoustic wave resonators according to a first example of a preferred embodiment of the present invention and a first comparative example.
Figure 8:
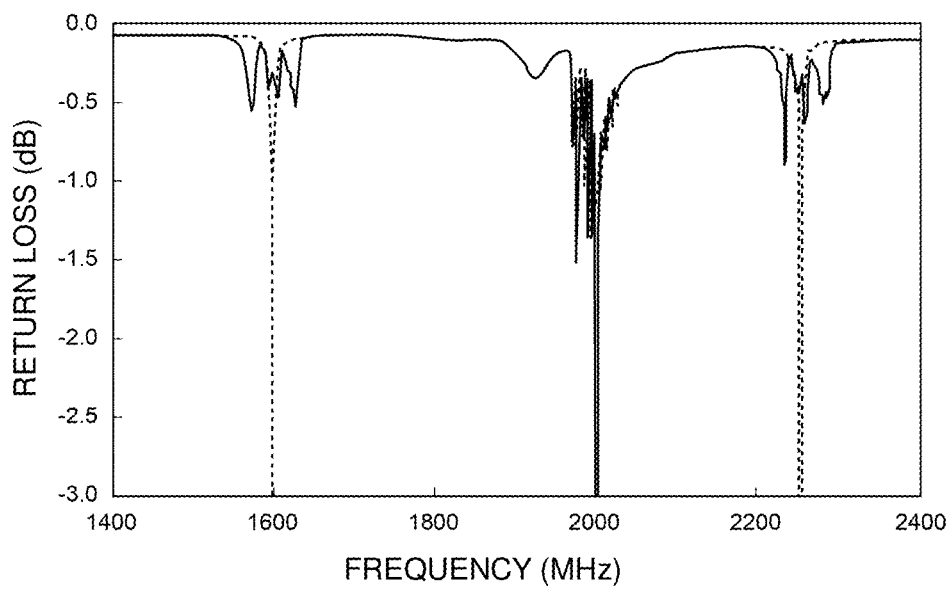
FIG. 8 is a graph illustrating return loss characteristics of the acoustic wave resonators according to the first example and the first comparative example.

When a bandpass filter includes the acoustic wave resonator 1 according to the present preferred embodiment, the acoustic wave resonator achieves improved characteristics in the pass band and can also reduce or prevent ripples outside the pass band, that is, can improve the characteristics outside the pass band. This will be described with reference to FIGS. 7 to 12. In FIG. 7, a solid line represents impedance characteristics of an acoustic wave resonator according to a first example of a preferred embodiment of the present invention, and a broken line represents impedance characteristics of an acoustic wave resonator according to a first comparative example. In FIG. 8, a solid line represents return loss characteristics of the acoustic wave resonator according to the first example, and a broken line represents return loss characteristics of the acoustic wave resonator according to the first comparative example.

Design parameters of the acoustic wave resonator according to the first example are as follows.

In the IDT electrode 3, withdrawal weighting was performed on the electrode fingers at a rate of one of eleven in the first region 31, withdrawal weighting was performed on the electrode fingers at a rate of one of twelve in the second region 32, and withdrawal weighting was performed on the electrode fingers at a rate of one of thirteen in the third region 33. The above-described withdrawal weighting was repeated for fifteen periods in each of the first region 31 to the third region 33.

Other design parameters of the IDT electrode 3 are as follows.

Piezoelectric material of the piezoelectric plate 2=LiTaO$_3$
Material of the IDT electrode 3 and material of the reflectors 4 and 5=Ti and AlCu
Film thickness of the IDT electrode 3 and film thickness of the reflectors 4 and 5=about 12 nm and about 145 nm
Wave length λ determined by the pitch of the electrode fingers
about 2.04 μm
Number of electrode fingers=540
Width of wide electrode fingers=about 1.53 μm
Overlap width=about 45 μm
Number of electrode fingers of reflectors=21

The first comparative example was configured to be the same or substantially the same as the acoustic wave resonator according to the first example except that withdrawal weighting was performed on the entire IDT electrode at a rate of one of twelve electrode fingers. That is, periodic withdrawal weighting was performed entirely in the acoustic wave resonator according to the first comparative example. As is apparent from FIGS. 7 and 8, large ripples appear at around 1600 MHz and around 2260 MHz in the first comparative example. In contrast, such ripples are successfully reduced or prevented with the acoustic wave resonator according to the first example. In addition, as in the first comparative example, resonant resistance in the first example is sufficiently low in the impedance characteristics illustrated in FIG. 7. This indicates that the ripple at frequencies lower than the resonant frequency and the ripple at frequencies higher than the anti-resonant frequency can be effectively reduced or prevented while the resonance characteristics are maintained.

Figure 9:
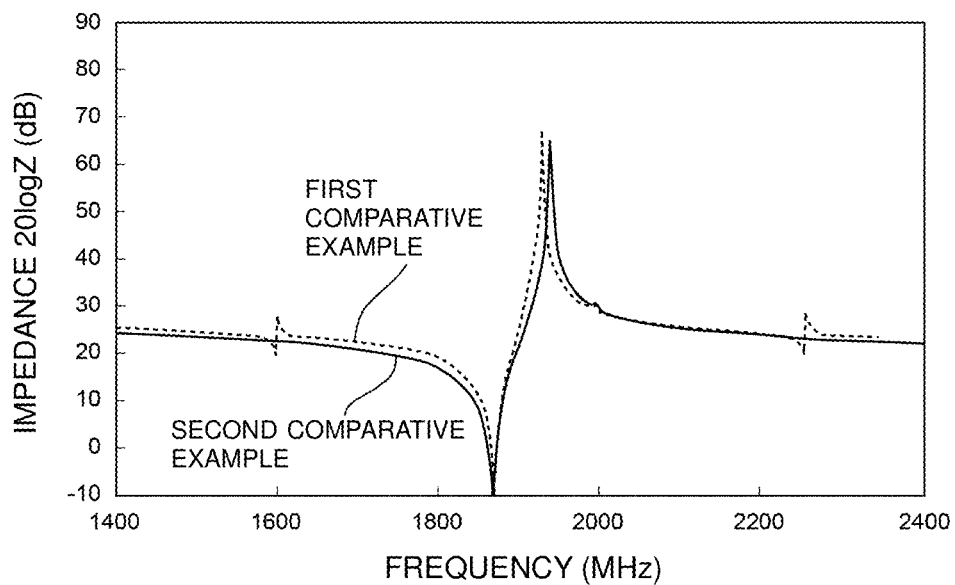
FIG. 9 is a graph illustrating impedance characteristics of acoustic wave resonators according to the first comparative example and a second comparative example.
Figure 10:
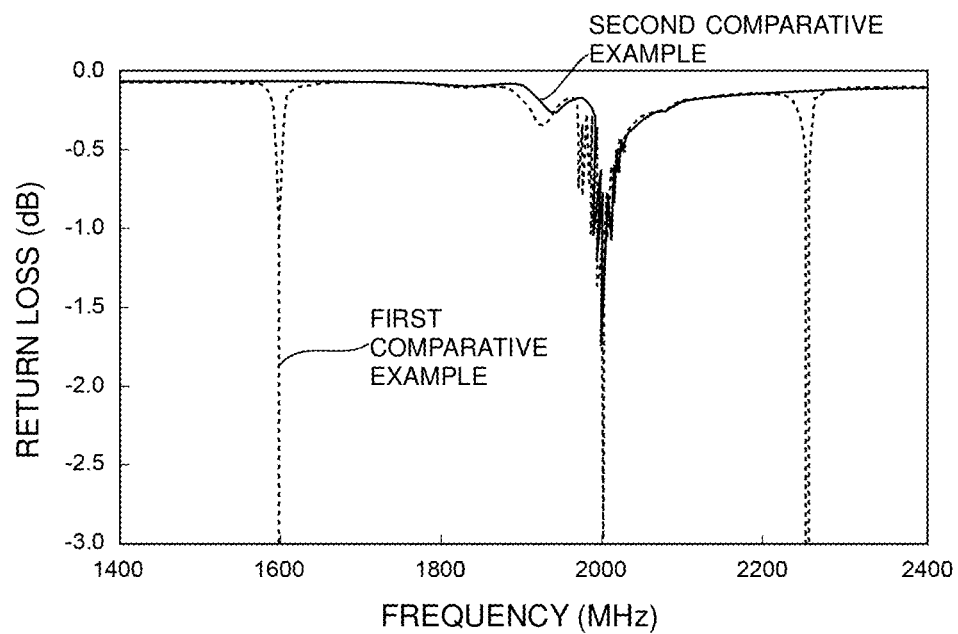
FIG. 10 is a graph illustrating return loss characteristics of the acoustic wave resonators according to the first comparative example and the second comparative example.

An acoustic wave resonator according to a second comparative example was prepared. The second comparative example was configured to be the same or substantially the same as the first example except that the withdrawal weighting described above was not performed. Thus, no withdrawal weighting was performed on an IDT electrode of the acoustic wave resonator according to the second comparative example. A solid line in FIG. 9 represents the impedance characteristics of the acoustic wave resonator according to the second comparative example. A solid line in FIG. 10 represents the return loss characteristics of the acoustic wave resonator according to the second comparative example. For comparison, a broken line in FIG. 9 and a broken line in FIG. 10 respectively represent the impedance characteristics and the return loss characteristics of the acoustic wave resonator of the first comparative example described above.

As is apparent from FIGS. 9 and 10, neither the ripple at around 1600 MHz nor the ripple at around 2260 MHz are caused with the acoustic wave resonator according to the second comparative example that includes the IDT electrode on which withdrawal weighting is not performed. However, as is apparent from FIG. 9, a frequency difference Δf between the resonant frequency and the anti-resonant frequency of the acoustic wave resonator according to the second comparative example is larger than a frequency difference Δf for the acoustic wave resonator according to the first comparative example. Thus, when the acoustic wave resonator according to the second comparative example is used, it is difficult to increase the steepness of the filter characteristics of a ladder filter, for example. Therefore, when the acoustic wave resonator according to the second comparative example is used, it is difficult to obtain good filter characteristics.

Figure 11:
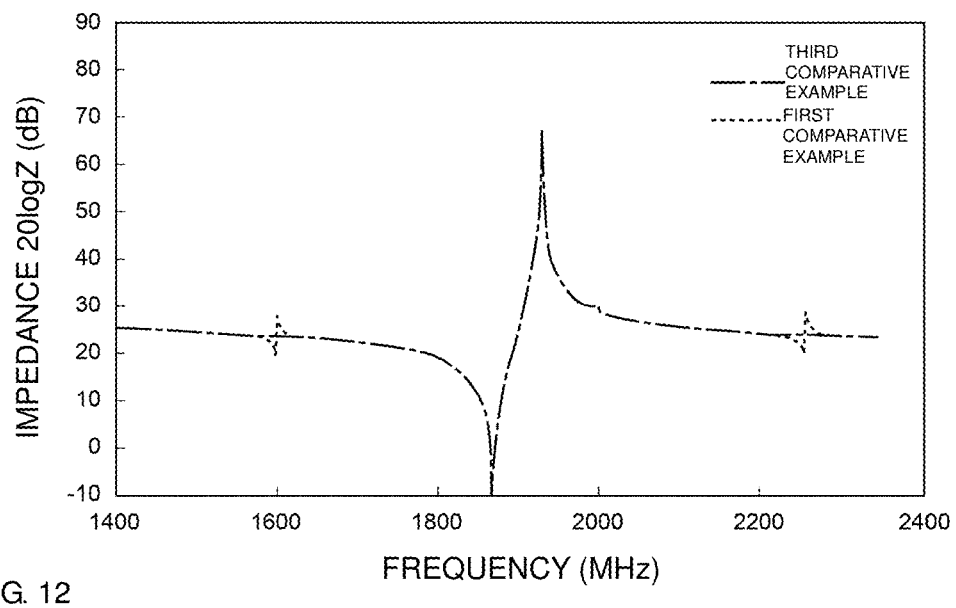
FIG. 11 is a graph illustrating impedance characteristics of acoustic wave resonators according to the first comparative example and a third comparative example.
Figure 12:
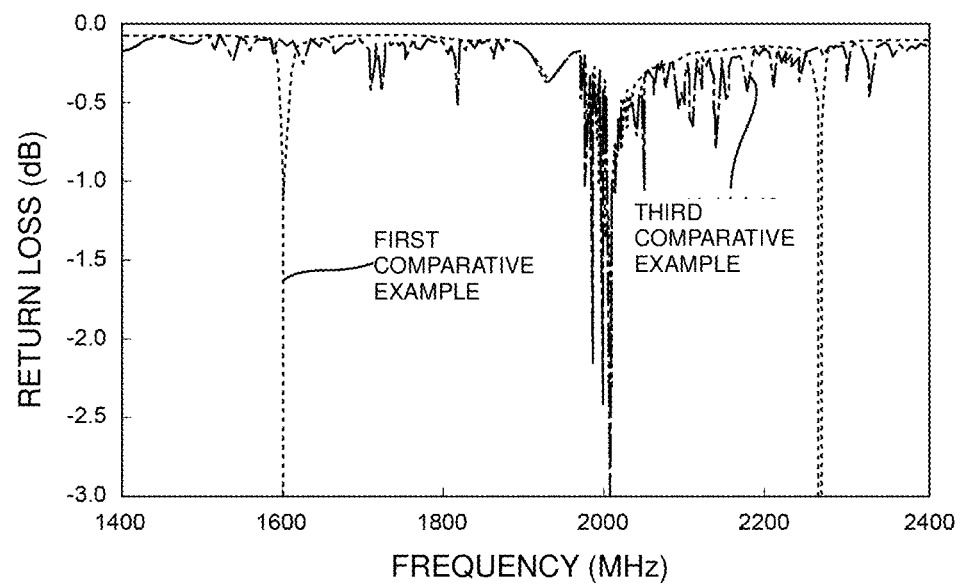
FIG. 12 is a graph illustrating return loss characteristics of the acoustic wave resonators according to the first comparative example and the third comparative example.

Then, an acoustic wave resonator on which withdrawal weighting is randomly performed so that withdrawal is not periodic was prepared as an acoustic wave resonator according to a third comparative example. In this case, the electrode fingers were withdrawn at a rate of one of twelve but portions in which the electrode fingers were withdrawn are randomly arranged in the acoustic wave propagation direction. That is, withdrawal weighting was performed on the IDT electrode so that withdrawal is not periodic. In FIG. 11, a dot-dash line represents the impedance characteristics of the acoustic wave resonator according to the third comparative example, and a broken line represents the impedance characteristics of the acoustic wave resonator according to the first comparative example. In addition, in FIG. 12, a dot-dash line represents the return loss characteristics of the acoustic wave resonator according to the third comparative example, and a broken line represents the return loss characteristics of the acoustic wave resonator according to the first comparative example.

As is apparent from FIG. 11, the ripple at around 1600 MHz and the ripple at around 2260 MHz, which appear for the acoustic wave resonator according to the first comparative example, do not appear for the acoustic wave resonator according to the third comparative example. Although it is not necessarily apparent from FIG. 11, the impedance at the resonant frequency of the acoustic wave resonator according to the first comparative example is about −10 dB, whereas the impedance at the resonant frequency of the acoustic wave resonator according to the third comparative example is about −8 dB. That is, the impedance at the resonant frequency of the acoustic wave resonator according to the third comparative example deteriorates.

This indicates that in the third comparative example in which withdrawal weighting was randomly performed on the entire IDT electrode, the resonant resistance deteriorates and good characteristics in the band were not obtained, compared to the acoustic wave resonator according to the first comparative example, that is, the acoustic wave resonator in which withdrawal weighting was periodically performed on the entire IDT electrode.

As described above, as is apparent from FIGS. 7 to 12, in the case where periodic withdrawal weighting was performed in each of the first region 31 to the third region 33 and the periodicities of withdrawal weighting in the first region 31 to the third region 33 are different from one another, deterioration in resonant resistance is less likely to occur and the frequency difference between the resonant frequency and the anti-resonant frequency is decreased. Thus, when the acoustic wave resonator is used in a bandpass filter, the characteristics in the pass band of the bandpass filter are improved. In addition, ripples that appear outside a frequency range between the resonant frequency and the anti-resonant frequency are reduced or prevented. Thus, with a bandpass filter including the acoustic wave resonator according to the first example, the characteristics outside the pass band are improved. Therefore, the characteristics in a pass band of another bandpass filter that is connected to the bandpass filter in common and that has a different pass band are improved.

As described above, in preferred embodiments of the present invention, it is sufficient that the periodicity of withdrawal weighting in at least one region among a plurality of regions is different from the periodicity of withdrawal weighting in at least another one of the regions. The periods of withdrawal weighting in the first region 31 to the third region 33, which are the plurality of regions, need not be different from one another as in the preferred embodiment described above. However, the periodicities of withdrawal weighting in the plurality of regions are preferably different from one another as in the preferred embodiment described above. In such a case, both the characteristics in the pass band and the characteristics outside the pass band are improved more effectively.

Figure 22:
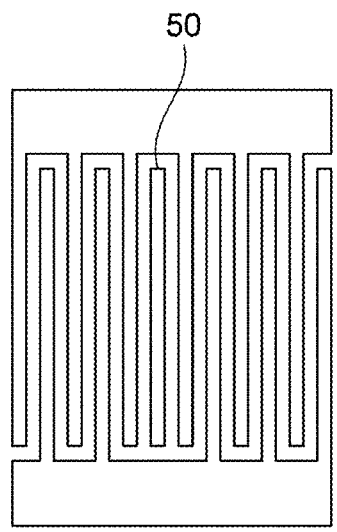
FIG. 22 is a plan view of a portion of an IDT electrode for describing another example of withdrawal weighting.

In the first preferred embodiment, withdrawal weighting is performed so that the IDT electrode 3 includes the wide electrode fingers 7a, 7b, 9, 11a, and 11b. Alternatively, withdrawal weighting may be performed by providing a floating electrode finger 50 in one region of the IDT electrode as illustrated in FIG. 22. The floating electrode finger 50 is provided in at least one of the portions in which the first electrode fingers or the second electrode fingers are located, in place of the corresponding first electrode finger or the corresponding second electrode finger. That is, withdrawal weighting on the IDT electrode is not limited to withdrawal weighting with the wide electrode fingers, and may be withdrawal weighting using floating electrode fingers. Also in such a case, it is sufficient that the periodicity of withdrawal weighting in at least one region among a plurality of regions is different from the periodicity of withdrawal weighting in at least another one of the regions.

Withdrawal weighting is performed on the IDT electrode 3 in the above-described manner in the acoustic wave resonator 1. Thus, when a bandpass filter, for example, a ladder acoustic wave filter includes the acoustic wave resonator 1, both the characteristics in the pass band and the characteristics outside the pass band are improved. This will be clarified through description of a preferred embodiment of a multiplexer illustrated in FIGS. 13 and 14.

Figure 13:
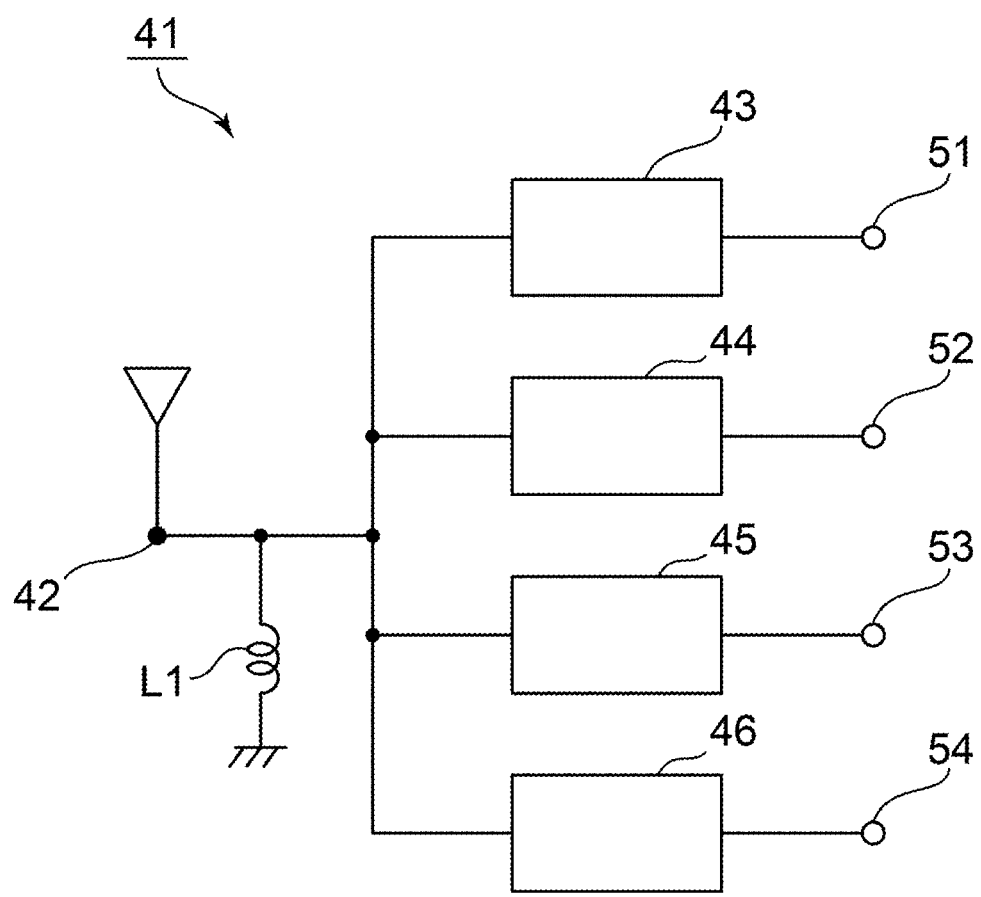
FIG. 13 is a schematic circuit diagram of a multiplexer according to a second preferred embodiment of the present invention.
Figure 14:
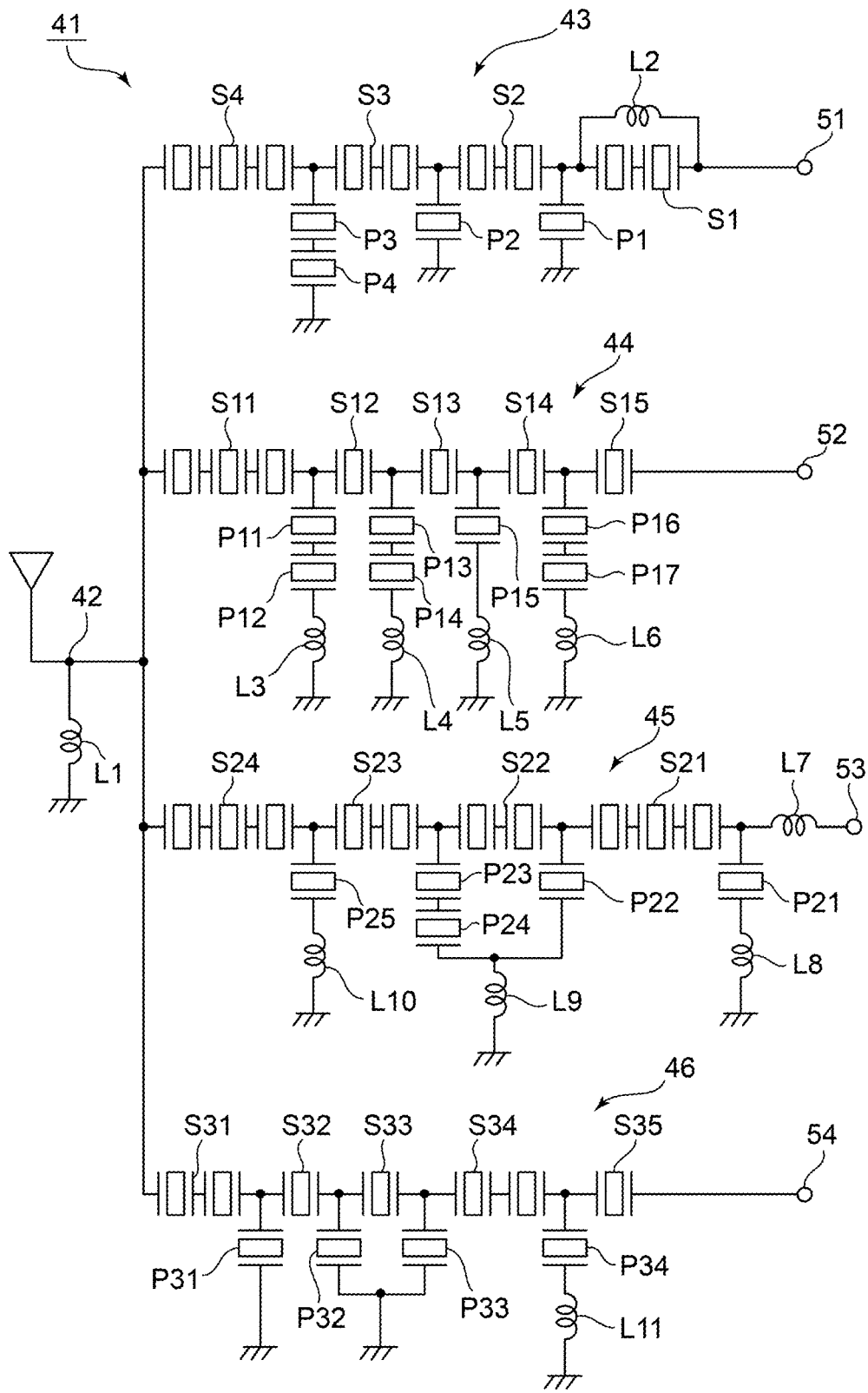
FIG. 14 is a diagram illustrating a specific circuit configuration of the multiplexer illustrated in FIG. 13.

FIG. 13 is a schematic circuit diagram of a multiplexer according to a second preferred embodiment of the present invention. FIG. 14 is a diagram illustrating a specific circuit configuration of the multiplexer 41 illustrated in FIG. 13.

The multiplexer 41 includes a common terminal 42, which is a terminal closest to an antenna. One end of each of a first bandpass filter 43 to a fourth bandpass filter 46, which are a plurality of bandpass filters, is connected in common to the common terminal 42. The multiplexer 41 is a quadplexer including the first bandpass filter 43, the second bandpass filter 44, the third bandpass filter 45, and the fourth bandpass filter 46. An inductor L1 is connected between the common terminal 42 and a ground potential. The inductor L1 is provided to achieve impedance matching.

As illustrated in FIG. 14, each of the first bandpass filter 43 to the fourth bandpass filter 46 is a ladder acoustic wave filter including a plurality of series-arm resonators and a plurality of parallel-arm resonators. The series-arm resonators and the parallel-arm resonators are defined by acoustic wave resonators.

The first bandpass filter 43 is a Band1 transmission filter, for example. The second bandpass filter 44 is a Band1 reception filter, for example.

The third bandpass filter 45 is a Band3 transmission filter, for example. The fourth bandpass filter 46 is a Band3 reception filter, for example.

The pass band of the Band1 transmission filter is about 1920 MHz to about 1980 MHz, for example. The pass band of the Band1 reception filter is about 2110 MHz to about 2170 MHz, for example. The pass band of the Band3 transmission filter is about 1710 MHz to about 1785 MHz, for example. The pass band of the Band3 reception filter is about 1805 MHz to about 1880 MHz, for example.

Thus, the pass bands of the first bandpass filter 43 to the fourth bandpass filter 46 are different from one another.

In the multiplexer 41, withdrawal weighting is performed on the IDT electrodes of the acoustic wave resonators defining the first bandpass filter 43 to the fourth bandpass filter 46 as described in the preferred embodiment above.

The first bandpass filter 43 is connected between a Band1 transmission terminal 51 and the common terminal 42. Series-arm resonators S1 to S4 are connected between the transmission terminal and the common terminal 42. In addition, parallel-arm resonators P1 to P4 are connected between the series arm and the ground potential. Note that each of the series-arm resonators S1, S2, and S3 is divided into two resonators. The series-arm resonator S4 is divided into three resonators. An inductor L2 is connected in parallel with the series-arm resonator S1.

In the second bandpass filter 44, series-arm resonators S11 to S15 are connected between a Band1 reception terminal 52 and the common terminal 42. Parallel-arm resonators P11 to P17 are connected between the series arm and the ground potential. An inductor L3 is connected between the parallel-arm resonator P12 and the ground potential. An inductor L4 is connected between the parallel-arm resonator P14 and the ground potential. An inductor L5 is connected between the parallel-arm resonator P15 and the ground potential. An inductor L6 is connected between the parallel-arm resonator P17 and the ground potential. The series-arm resonator S11 is divided into three resonators.

The third bandpass filter 45 is connected between a Band3 transmission terminal 53 and the common terminal 42. Series-arm resonators S21, S22, S23, and S24 are disposed sequentially from a side closer to the transmission terminal 53. Each of the series-arm resonators S21 and S24 is divided into three resonators, and each of the series-arm resonators S22 and S23 is divided into two resonators. An inductor L7 is connected between the transmission terminal 53 and the series-arm resonator S21.

Parallel-arm resonators P21 to P25 are connected between the series arm and the ground potential. An inductor L8 is connected between the parallel-arm resonator P21 and the ground potential. One end of the parallel-arm resonator P22 and one end of the parallel-arm resonator P24 are connected in common and are connected to the ground potential with an inductor L9 interposed between the ground potential and the parallel-arm resonators P22 and P24. An inductor L10 is connected between the parallel-arm resonator P25 and the ground potential.

The fourth bandpass filter 46 is connected between a Band3 reception terminal 54 and the common terminal 42. Series-arm resonators S31 to S35 are disposed sequentially from a side closer to the common terminal 42. Each of the series-arm resonator S31 and S34 is divided into two resonators. Parallel-arm resonators P31 to P34 are connected between the series arm and the ground potential. An inductor L11 is connected between an end portion of the parallel-arm resonator P34 closer to the ground potential and the ground potential.

Design parameters of the first bandpass filter 43 to the fourth bandpass filter 46 according to a second example which corresponds to the second preferred embodiment are set as shown in Table 1 to Table 4 below.

TABLE 1

First bandpass filter 43 (B1Tx)

|  | S1 | P1 | S2 | P2 | S3 | P3, P4 | S4 |
|---|---|---|---|---|---|---|---|
| IDT wave length (μm) | 1.924 | 2.003 | 1.93 | 2.011 | 1.937 | 2.011 | 1.922 |
| REF wave length (μm) | 1.924 | 2.003 | 1.93 | 2.011 | 1.937 | 2.011 | 1.922 |
| Overlap width (μm) | 29 | 37 | 12 | 56 | 81 | 27 | 32 |
| Number of pairs of electrode fingers of IDT | 140 | 200 | 200 | 118 | 120 | 82 | 140 |
| Number of pairs of electrode fingers of REF | 10 | 10 | 10 | 10 | 10 | 10 | 10 |
| Duty | 0.5 | 0.5 | 0.5 | 0.5 | 0.5 | 0.5 | 0.5 |

TABLE 2

Second bandpass filter 44 (B1Rx)

|  | S11 | P11, P12 | S12 | P13, P14 | S13 | P15 | S14 | P16, P17 | S15 |
|---|---|---|---|---|---|---|---|---|---|
| IDT wave length (μm) | 1.745 | 1.842 | 1.819 | 1.898 | 1.808 | 1.896 | 1.805 | 1.872 | 1.825 |
| REF wave length (μm) | 1.745 | 1.842 | 1.819 | 1.898 | 1.808 | 1.896 | 1.805 | 1.872 | 1.825 |
| Overlap width (μm) | 22 | 23 | 23 | 19 | 21 | 19 | 20 | 24 | 33 |
| Number of pairs of electrode fingers of IDT | 120 | 235 | 80 | 110 | 150 | 110 | 100 | 245 | 165 |
| Number of pairs of electrode fingers of REF | 10 | 10 | 10 | 10 | 10 | 10 | 10 | 10 | 10 |
| Duty | 0.5 | 0.5 | 0.5 | 0.5 | 0.5 | 0.5 | 0.5 | 0.5 | 0.5 |

TABLE 3

Third bandpass filter 45 (B3Tx)

|  | S21 | P21 | S22 | P22 | S23 | P23, P24 | S24 | P25 |
|---|---|---|---|---|---|---|---|---|
| IDT wave length (μm) | 2.141 | 2.252 | 2.173 | 2.254 | 2.175 | 2.256 | 2.157 | 2.268 |
| REF wave length (μm) | 2.141 | 2.252 | 2.173 | 2.254 | 2.175 | 2.256 | 2.157 | 2.268 |
| Overlap width (μm) | 26 | 42 | 68 | 117 | 32 | 65 | 46 | 27.6 |
| Number of pairs of electrode fingers of IDT | 200 | 33 | 293 | 60 | 230 | 130 | 230 | 200 |
| Number of pairs of electrode fingers of REF | 10 | 10 | 10 | 10 | 10 | 10 | 10 | 10 |
| Duty | 0.5 | 0.5 | 0.5 | 0.5 | 0.5 | 0.5 | 0.5 | 0.5 |

TABLE 4

Fourth bandpass filter 46 (B3Rx)

|  | S31 | P31 | S32 | P32 | S33 | P33 | S34 | P34 | S35 |
|---|---|---|---|---|---|---|---|---|---|
| IDT wave length (μm) | 2.027 | 2.121 | 2.033 | 2.126 | 2.045 | 2.123 | 2.035 | 2.125 | 2.048 |
| REF wave length (μm) | 2.027 | 2.121 | 2.033 | 2.126 | 2.045 | 2.123 | 2.035 | 2.125 | 2.048 |
| Overlap width (μm) | 26 | 31 | 40 | 57 | 18 | 45 | 19 | 43 | 36 |
| Number of pairs of electrode fingers of IDT | 120 | 200 | 90 | 200 | 120 | 150 | 180 | 150 | 165 |
| Number of pairs of electrode fingers of REF | 10 | 10 | 10 | 10 | 10 | 10 | 10 | 10 | 10 |
| Duty | 0.5 | 0.5 | 0.5 | 0.5 | 0.5 | 0.5 | 0.5 | 0.5 | 0.5 |

In addition, for comparison, a multiplexer according to a fourth comparative example is prepared, which is configured to be the same or substantially the same as in the second example except that the IDT electrodes of the acoustic wave resonators defining the first bandpass filter 43 to the fourth bandpass filter 46 are configured as in the acoustic wave resonators according to the first comparative example described above.

Figure 15:
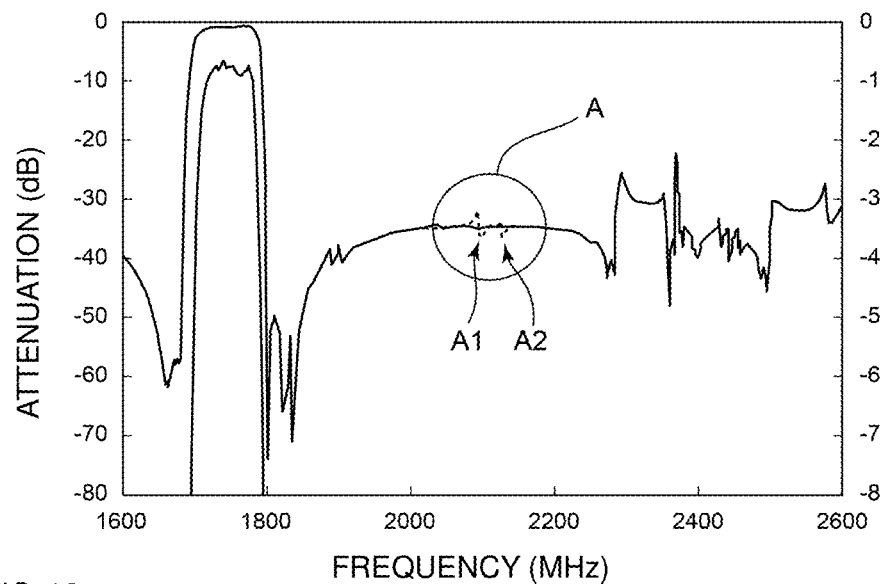
FIG. 15 is a graph illustrating bandpass characteristics of bandpass filters which are Band3 transmission filters in multiplexers according to a second example of a preferred embodiment of the present invention and a fourth comparative example.
Figure 16:
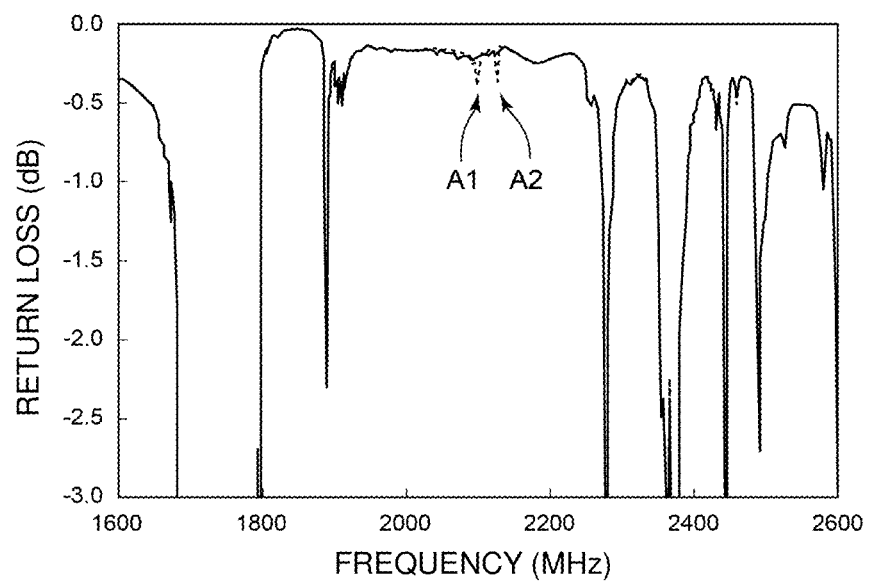
FIG. 16 is a graph illustrating return loss characteristics on a side closer to a common terminal, which is a terminal closer to an antenna, of the bandpass filters which are Band3 transmission filters in the multiplexers according to the second example and the fourth comparative example.

A solid line in FIG. 15 represents the bandpass characteristics of the Band3 transmission filter, that is, the third bandpass filter 45, of the multiplexer 41 according to the second example. A broken line in FIG. 15 represents the bandpass characteristics of the Band3 transmission filter of the multiplexer according to the fourth comparative example. In FIG. 16, a solid line represents the return loss characteristics on a side, closer to the common terminal 42, of the Band3 transmission filter, that is, the third bandpass filter 45 of the multiplexer 41 according to the second example, and a broken line represents the return loss characteristics on a side, closer to the common terminal, of the Band3 transmission filter according to the fourth comparative example.

Figure 17:
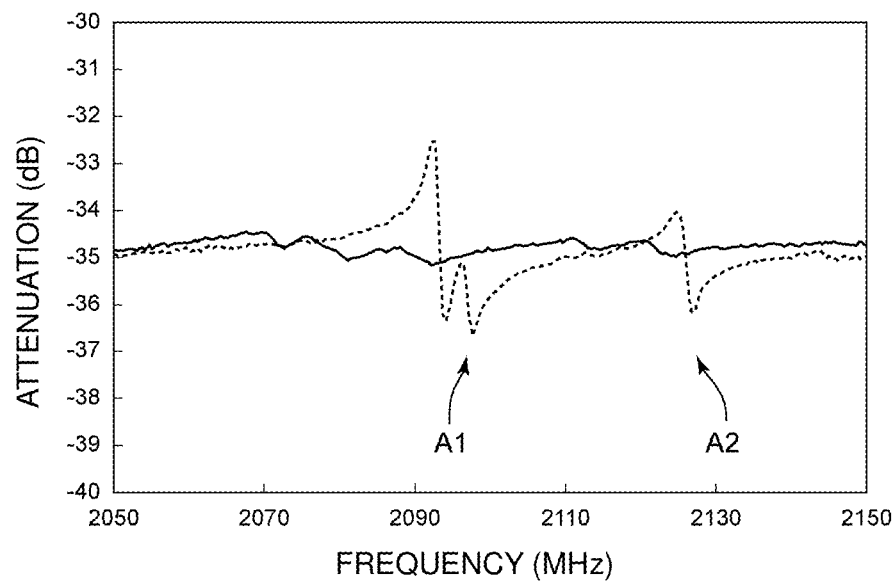
FIG. 17 is an enlarged graph illustrating a portion indicated by a circle A in FIG. 15 in an enlarged manner.

In FIG. 16, ripples indicated by arrows A1 and A2 appear in a range from about 2110 MHz to about 2170 MHz, which is the pass band of the Band1 reception filter, in the fourth comparative example. A portion enclosed by a circle A in FIG. 15 is illustrated in FIG. 17 in an enlarged manner. Large ripples indicated by arrows A1 and A2 appear in the fourth comparative example. In contrast, these ripples are sufficiently reduced or prevented in the second example. According to the second example, attenuation characteristics in the portion in which these ripples appear are successfully improved by about 3 dB as a result of reducing or preventing these ripples, compared to the fourth comparative example.

Figure 18:
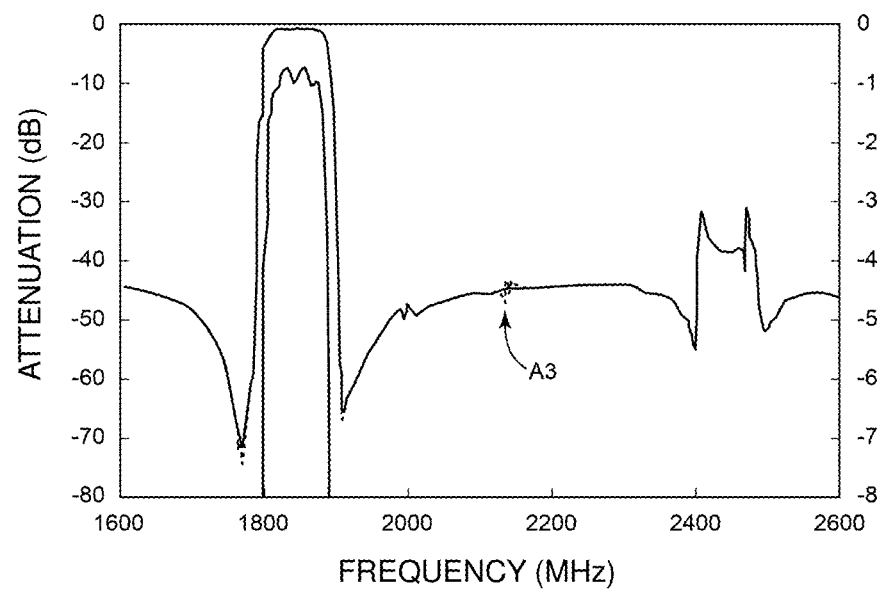
FIG. 18 is a graph illustrating bandpass characteristics of bandpass filters which are Band3 reception filters in the multiplexers according to the second example and the fourth comparative example.
Figure 19:
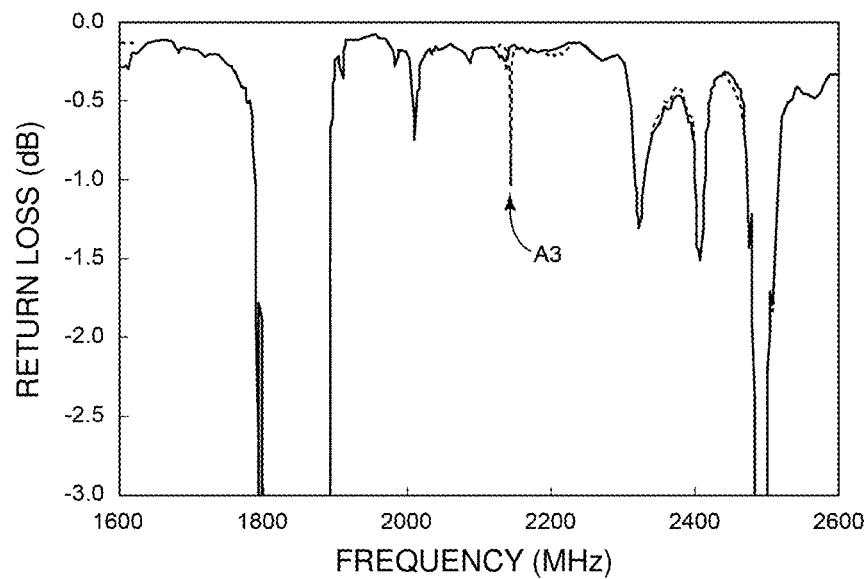
FIG. 19 is a graph illustrating return loss characteristics on a side closer to the common terminal, which is the terminal closer to the antenna, of the bandpass filters which are Band3 reception filters in the multiplexers according to the second example and the fourth comparative example.

In FIG. 18, a solid line represents the bandpass characteristics of the Band3 reception filter according to the second example, that is, the fourth bandpass filter 46, and a broken line represents the bandpass characteristics of the Band3 reception filter according to the fourth comparative example. In addition, in FIG. 19, a solid line represents the return loss characteristics on a side, closer to the common terminal 42, of the fourth bandpass filter 46 according to the second example, and a broken line represents the return loss characteristics on a side, closer to the common terminal, of the Band3 reception filter according to the fourth comparative example. As is apparent from FIGS. 18 to 19, a ripple indicated by an arrow A3 appears in the fourth comparative example in a range from about 2110 MHz to about 2170 MHz, which is the pass band of the Band1 reception filter. In contrast, this large ripple is reduced or prevented in the second example.

This indicates that a ripple that is caused outside the pass band is able to be reduced or prevented while the characteristics in the pass band are maintained in the fourth bandpass filter 46 which is the Band3 reception filter.

Figure 20:
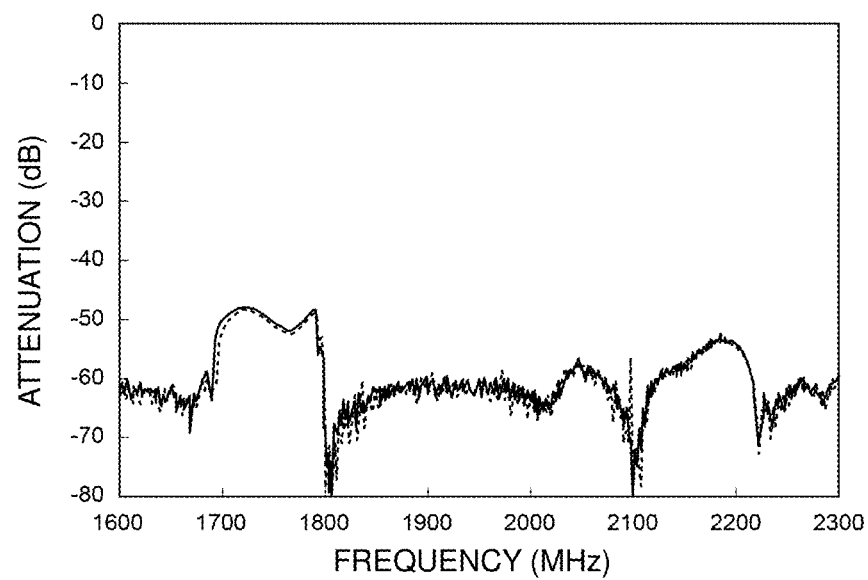
FIG. 20 is a graph illustrating isolation characteristics from the Band3 transmission filters to Band1 reception filters in the multiplexers according to the second example and the fourth comparative example.
Figure 21:
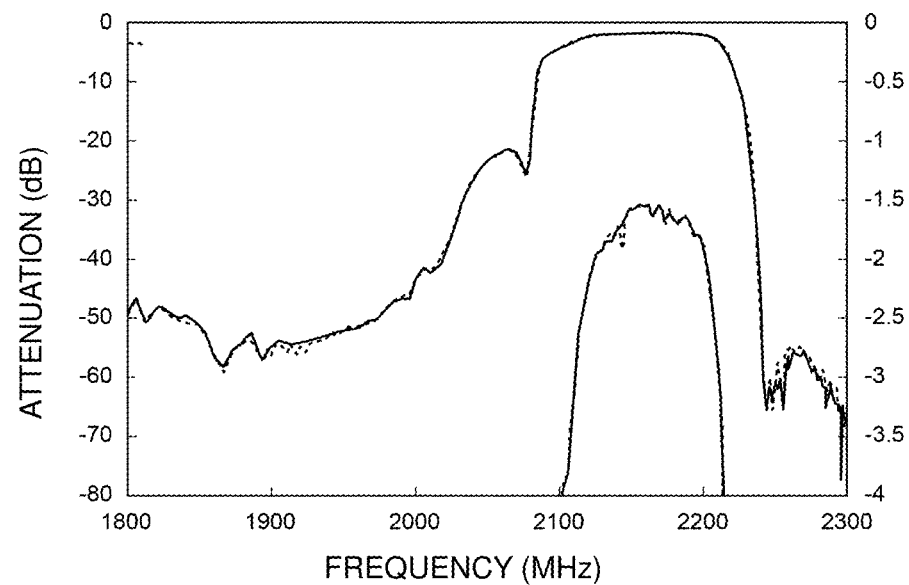
FIG. 21 is a graph illustrating bandpass characteristics from the common terminal to the Band1 reception filters in the multiplexers according to the second example and the fourth comparative example.

In FIG. 20, a solid line represents the isolation characteristics from the Band3 transmission filter to the Band1 reception filter in the second example, and a broken line represents the isolation characteristics according to the fourth comparative example. FIG. 21 illustrates the bandpass characteristics from a side closer to the antenna to a side closer to the Band1 reception filter. A solid line represents a result for the second example, and a broken line represents a result for the fourth comparative example.

As is apparent from FIG. 20, a large peak of about 12 dB appears in a range from about 2090 MHz to about 2100 MHz in the fourth comparative example. In contrast, such a peak does not appear in the second example. That is, the isolation characteristics are effectively improved.

In addition, as is apparent from FIG. 21, a large ripple of about 0.2 dB appears in a band around 2130 MHz in the bandpass characteristics in the fourth comparative example. In contrast, such a ripple does not appear in the second example.

This indicates that the characteristics are improved and the loss is reduced or prevented in the pass band of the Band1 reception band.

As described above, the use of the first bandpass filter 43 to the fourth bandpass filter 46 in the multiplexer according to the present preferred embodiment of the present invention makes it possible to improve the characteristics outside the pass band of each of the bandpass filters 43 to 46 while maintaining the characteristics in the pass band.

Thus, the characteristics in the pass bands of the other bandpass filters that are connected in common are improved.

In the preferred embodiments described above, the quadplexer including the first bandpass filter 43 to the fourth bandpass filter 46 is described. However, the multiplexer according to the present invention is not limited to the quadplexer. The multiplexer may be a duplexer, a triplexer, or a multiplexer in which five or more bandpass filters are connected in common.

In addition, the pass bands of the plurality of bandpass filters need not be different from one another, and it is sufficient that the pass band of at least one of the bandpass filters is different from the pass band of at least another one of the bandpass filters.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave resonator comprising:
    a piezoelectric body; and
    an IDT electrode on or above the piezoelectric body and including withdrawal weighted portions in each of a plurality of regions in an acoustic wave propagation direction for at least three periods; wherein
    a periodicity of the periodic withdrawal weighted portion in at least one of the plurality of regions is different from a periodicity of the periodic withdrawal weighted portion in at least another one of the plurality of regions.

2. The acoustic wave resonator according to claim 1, wherein periodicities of the withdrawal weighted portions in the plurality of regions are different from one another.

3. The acoustic wave resonator according to claim 1, wherein at least one of the withdrawal weighted portions is asymmetric on respective sides of a center of the IDT electrode in the acoustic wave propagation direction.

4. The acoustic wave resonator according to claim 1, wherein the IDT electrode includes a plurality of first electrode fingers and a plurality of second electrode fingers that interdigitate with each other, and at least one of the withdrawal weighted portions includes a wide electrode finger with a larger width-direction dimension than the first electrode fingers in the acoustic wave propagation direction.

5. The acoustic wave resonator according to claim 1, wherein the IDT electrode includes a plurality of first electrodes and a plurality of second electrodes that interdigitate with each other, and at least one of the withdrawal weighted portions includes a floating electrode finger provided in at least one of portions in which the first electrode fingers or the second electrode fingers are located, in place of the corresponding first electrode finger or the corresponding second electrode finger.

6. The acoustic wave resonator according to claim 1, further comprising reflectors disposed on respective sides of the IDT electrode in the acoustic wave propagation direction.

7. The acoustic wave resonator according to claim 1, wherein the piezoelectric body is defined by a piezoelectric plate.

8. The acoustic wave resonator according to claim 7, wherein the piezoelectric plate is made of $LiNbO_3$ or $LiTaO_3$.

9. The acoustic wave resonator according to claim 1, wherein the piezoelectric body is defined by a piezoelectric film stacked on or above a semiconductor layer or an insulating layer.

10. The acoustic wave resonator according to claim 1, wherein the plurality of regions include at least three regions.

11. The acoustic wave resonator according to claim 1, wherein the plurality of regions are arranged parallel or substantially parallel to the acoustic wave propagation direction.

12. A multiplexer comprising:
    a common terminal; and
    a plurality of bandpass filters each including one end connected in common to the common terminal; wherein
    at least one of the plurality of bandpass filters has a pass band that is different from pass bands of others of the plurality of bandpass filters;

the at least one of the bandpass filters is an acoustic wave filter including a plurality of acoustic wave resonators; and at least one of the plurality of acoustic wave resonators is defined by the acoustic wave resonator according to claim 1.

13. The multiplexer according to claim 12, wherein the plurality of bandpass filters have pass bands that are different from one another.

14. The multiplexer according to claim 12, wherein each of the plurality of bandpass filters is an acoustic wave filter including a plurality of acoustic wave resonators.

15. The multiplexer according to claim 12, wherein periodicities of the withdrawal weighted portions in the plurality of regions are different from one another.

16. The multiplexer according to claim 12, wherein at least one of the withdrawal weighted portions is asymmetric on respective sides of a center of the IDT electrode in the acoustic wave propagation direction.

17. The multiplexer according to claim 12, wherein the IDT electrode includes a plurality of first electrode fingers and a plurality of second electrode fingers that interdigitate with each other, and at least one of the withdrawal weighted portions includes a wide electrode finger with a larger width-direction dimension than the first electrode fingers in the acoustic wave propagation direction.

18. The multiplexer according to claim 12, wherein the IDT electrode includes a plurality of first electrodes and a plurality of second electrodes that interdigitate with each other, and at least one of the withdrawal weighted portions includes a floating electrode finger provided in at least one of portions in which the first electrode fingers or the second electrode fingers are located, in place of the corresponding first electrode finger or the corresponding second electrode finger.

19. The multiplexer according to claim 12, wherein the piezoelectric body is defined by a piezoelectric film stacked on or above a semiconductor layer or an insulating layer.

* * * * *